US010988839B2

(12) United States Patent
Hu et al.

(10) Patent No.: US 10,988,839 B2
(45) Date of Patent: Apr. 27, 2021

(54) EVAPORATION SOURCE AND EVAPORATION DEVICE

(71) Applicants: BOE Technology Group Co., Ltd., Beijing (CN); Hefei Xinsheng Optoelectronics Technology Co., Ltd., Anhui (CN)

(72) Inventors: Changqi Hu, Beijing (CN); Mengdi Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 252 days.

(21) Appl. No.: 16/106,136

(22) Filed: Aug. 21, 2018

(65) Prior Publication Data

US 2019/0218658 A1 Jul. 18, 2019

(30) Foreign Application Priority Data

Jan. 17, 2018 (CN) .......................... 201810045487.3

(51) Int. Cl.
*C23C 14/24* (2006.01)

(52) U.S. Cl.
CPC .................. *C23C 14/243* (2013.01)

(58) Field of Classification Search
CPC .................................................. C23C 14/243
See application file for complete search history.

(56) References Cited

U.S. PATENT DOCUMENTS

| 5,140,939 A * | 8/1992 | Valentian | C23C 14/243 |
| | | | 118/719 |
| 2003/0097989 A1* | 5/2003 | Shinde | C23C 14/083 |
| | | | 118/726 |
| 2004/0194702 A1* | 10/2004 | Sasaki | C23C 14/12 |
| | | | 118/715 |

* cited by examiner

*Primary Examiner* — Keath T Chen
(74) *Attorney, Agent, or Firm* — Arent Fox LLP; Michael Fainberg

(57) ABSTRACT

The disclosure discloses an evaporation source and an evaporation device. The evaporation source includes an evaporation case, a crucible, and a heating unit; the evaporation case includes a top plate, a bottom plate, a first side plate, a second side plate, a first end plate, and a second end plate; a connecting section is arranged on the side of the top plate facing the bottom plate, a nozzle group is arranged on the bottom plate to jet gas in the direction away from the top plate; and the crucible includes a cubicle body, and a folded side arranged on the outside of the crucible body, a plurality of gas outlet holes are arranged in the folded side, and the crucible body cooperates slidably with the connecting section through the folded side.

16 Claims, 3 Drawing Sheets

EVAPORATION SOURCE AND EVAPORATION DEVICE

CROSS-REFERENCES TO RELATED APPLICATIONS

This application claims priority to Chinese patent application No. 201810045487.3 filed on Jan. 17, 2018, which is incorporated herein by reference in its entirety.

FIELD

The present disclosure relates to the field of display technologies, and particularly to an evaporation source and an evaporation apparatus.

BACKGROUND

An Organic Light-Emitting Diode (OLED) display panel includes light-emitting elements composed of a plurality of functional layers. The existing OLED is generally fabricated through evaporation technology, and specifically by heating a material using heating wire so that the material is heated and evaporated into a film on the surface of a substrate.

However evaporation nozzles in an evaporation device in the traditional evaporation process are arranged faced upward, and the glass substrate is arranged above the evaporation nozzles, so for the substrate or a metal mask with a large size, the glass substrate may be deformed, the mask may be deformed, and particles may be produced as a result of friction between rolling wheels of the mask being conveyed, and deposited on the surface of the substrate, thus resulting in a defect of the product.

SUMMARY

In one aspect, an embodiment of the disclosure provides an evaporation source for an evaporation device. The evaporation source includes: an evaporation case, a crucible, and a heating unit, wherein the evaporation case includes a top plate and a bottom plate arranged opposite to each other, a first side plate and a second side plate located between the top plate and the bottom plate and arranged opposite to each other, a first end plate and a second end plate which are selectively opened and closed, located between the top plate and the bottom plate and arranged opposite to each other, and a connecting section arranged on a side of the top plate facing the bottom plate to cooperate slidably with the crucible so that the crucible enters or exits through an end portion corresponding to the first end plate and/or the second end plate, wherein the bottom plate is provided with a nozzle group configured to jet gas in a direction away from the top plate; the crucible includes a crucible body with an opening facing the top plate, and a folded side arranged on an outside of the crucible body, a plurality of gas outlet holes are arranged in the folded side, and the crucible body cooperates slidably with the connecting section through the folded side; and when the first end plate and the second end plate are closed, the crucible, the connecting section, the top plate, and the folded side cooperate to form an evaporation cell; and the heating unit is arranged inside the evaporation case and outside the evaporation cell.

In some embodiments, the connecting section includes a hook arranged on the top plate of the evaporation case, the hook includes a connection area extending in a direction from the top plate to the bottom plate, and a bearing area perpendicular to the extending direction of the connection area and configured to cooperate slidably with the folded side of the crucible, the folded side of the crucible laps a side of the bearing area facing the top plate, and the plurality of gas outlet holes of the crucible are arranged in a part of the folded side, which does not lap the bearing area.

In some embodiments, the evaporation source further includes a cooling unit configured to cool the evaporation case; and the cooling unit is arranged on an outside of the evaporation case, and the cooling unit includes a bottom cooling unit configured to support and cool the bottom plate of the evaporation case; the bottom cooling unit is removably connected with the evaporation chamber in the evaporation device through a connecting assembly; and the bottom cooling unit is provided with a slit so that the nozzle group extends out of the slit and faces a bottom of the evaporation chamber.

In some embodiments, the cooling unit further includes a top cooling unit configured to cool the top plate of the evaporation case, a first side cooling unit configured to cool the first side plate, and a second side cooling unit configured to cool the second side plate.

In some embodiments, the cooling unit is a water-cooling plate.

In some embodiments, the evaporation source further includes a heat preserving unit arranged on the outside of the evaporation case.

In some embodiments, the heat preserving unit includes a first side heat preserving plate arranged between the first side plate and the first side cooling unit, a second side heat preserving plate arranged between the second side plate and the second side cooling unit, a top heat preserving plate arranged between the top plate of the evaporation case and the top cooling unit, and a bottom heat preserving plate arranged between the bottom plate of the evaporation case and the bottom cooling unit.

In some embodiments, a fixing component is arranged on a side of the bottom cooling unit facing the evaporation case, and a long groove corresponding in shape to the fixing component is arranged on the bottom heat preserving plate, so that the fixing component extends out of the long groove to support and fix the evaporation case.

In some embodiments, the heating unit includes a first side heating plate arranged on a side of the first side plate facing the crucible, a second side heating plate arranged on a side of the second side plate facing the crucible, and a bottom heating plate arranged on a side of the bottom plate facing the crucible.

In another aspect, some embodiments of the disclosure further provide an evaporation device. The evaporation device includes an evaporation chamber, a bearing platform arranged in the evaporation chamber, and the evaporation source according to any one of the above embodiments arranged in the evaporation chamber, wherein: the bearing platform is provided with a bearing face on a side thereof facing the evaporation source, and the bearing platform is provided with a sliding assembly on a side thereof away from the bearing face, the bearing face is configured to bear a substrate, and the sliding assembly is configured to cooperate slidably with a bottom of the evaporation chamber so that the bearing platform slides relative to the bottom of the evaporation chamber.

In some embodiments, the evaporation chamber includes a connecting assembly arranged on a top of the evaporation chamber, and the evaporation source is connected removably with the connecting assembly through a bottom cooling unit.

In some embodiments, a fixing device configured to fix the substrate is arranged on the bearing face of the bearing platform.

In some embodiments, the fixing device includes a pair of right-angled positioning components located on a diagonal line, and an inner side of each right-angled positioning component is configured to clamp a corner of the substrate on the bearing face.

In some embodiments, the bearing face is arranged with at least one groove configured to enable the substrate to be picked.

In some embodiments, the side of the bearing platform away from the bearing face cooperates slidably with the bottom plate of the evaporation chamber through a sliding rail and a sliding groove.

In some embodiments, the side of the bearing platform away from the bearing face cooperates slidably with the bottom plate of the evaporation chamber through rolling wheels and a rolling rail.

DETAILED DESCRIPTION

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure.

Figure 1:
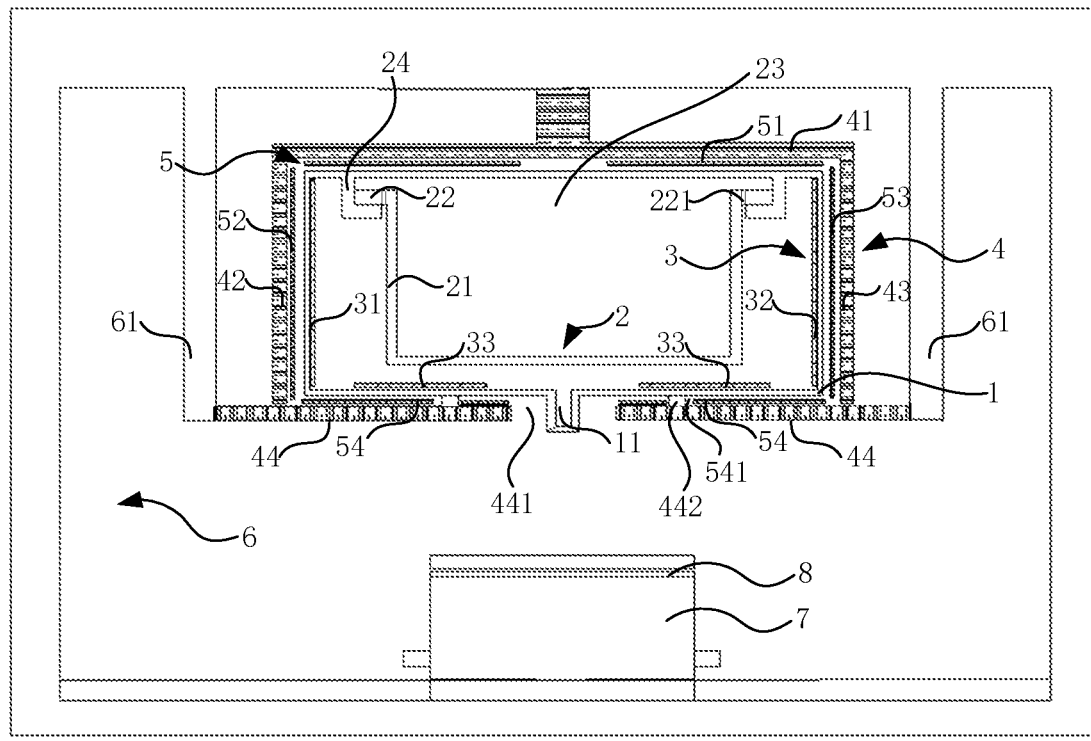
FIG. 1 is a schematic structural diagram of an evaporation source according to an embodiment of the disclosure.
Figure 2:
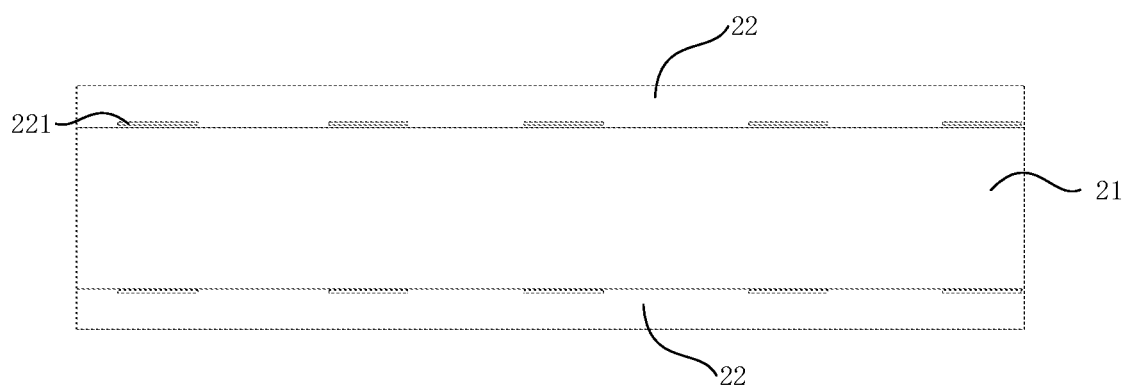
FIG. 2 is a schematic structural diagram of a crucible in FIG. 1.

Referring to FIG. 1 and FIG. 2, an embodiment of the disclosure provides an evaporation source for an evaporation device. The evaporation source includes an evaporation case 1, a crucible 2, and a heating unit 3.

The evaporation case 1 includes a top plate and a bottom plate arranged opposite to each other, a first side plate and a second side plate located between the top plate and the bottom plate and arranged opposite to each other, a first end plate and a second end plate which are selectively opened and closed, located between the top plate and the bottom plate and arranged opposite to each other, and two connecting sections arranged on a side of the top plate facing the bottom plate to cooperate slidably with the crucible 2 so that the crucible 2 enters or exits through an end portion(s) corresponding to the first end plate and/or the second end plate, where the bottom plate is provided with a nozzle group 11 configured to jet gas in the direction away from the top plate.

The crucible 2 includes a crucible body 21 with an opening 23 facing the top plate, and two folded sides 22 arranged on the outside of the crucible body 21, a plurality of gas outlet holes 221 are arranged in the folded sides 22, and the crucible body 21 cooperates slidably with the connecting sections through the folded sides 22; and when the first end plate and the second end plate are closed, the crucible 2, the connecting sections, the top plate, and the folded sides 22 cooperate to form an evaporation cell.

The heating unit 3 is arranged inside the evaporation case 1 and outside the evaporation cell.

In the evaporation source according to the embodiment of the disclosure, the evaporation source includes the evaporation case 1, the crucible 2, and the heating unit 3. Since the bottom plate of the evaporation case 1 is provided with the nozzle group 11 configured to jet gas in the direction away from the top plate, the nozzle group of the evaporation case 1 located in an evaporation chamber 6 faces the bottom of the evaporation chamber 6. Furthermore since there are two operating positions of the first end plate and the second end plate in the evaporation case 1, when the first end plate and/or the second end plate are opened, the crucible 2 may cooperate slidably with the connecting section arranged in the evaporation case 1 through the folded side 22, and enter and exit the evaporation case 1 through the end portion corresponding to the first end plate and/or the second end plate, so an operating worker may fill and replace a material in the crucible body 21; and when the first end plate and the second end plate are closed, since the crucible 2, the connecting section, the top plate, and the folded side 22 in the heating case cooperate to form the evaporation cell. After the material filled in the crucible 2 is evaporated into organic vapor, the organic vapor may be guided out of the evaporation cell through the gas outlet holes 221 in the folded side 22, and enter a space formed by the outside of the evaporation cell and the inner wall of the evaporation case 1, and thereafter may be jetted out of the nozzle group 11 on the bottom plate of the evaporation case 1, and be deposited into a film on the substrate 8. It shall be noted that the heating unit 3 arranged between the evaporation case 1 and the evaporation cell may heat the organic vapor to be jetted out of the nozzle group 11, so there is no cooling area of the flowing gas, and thus the gas may not be condensed in the evaporation case 1, so that the gas can flow stably over a flow path, thus resulting in a higher utilization ratio of the material.

In summary, the evaporation source according to the embodiment of the disclosure is arranged upside down as a whole, so that the nozzle group 11 in the evaporation source faces the bottom of the evaporation chamber 6. Furthermore in the evaporation source according to the embodiment of the disclosure, the first end plate and the second end plate of the evaporation case 1 can be opened and closed selectively, and the crucible 2 in the evaporation case 1 can cooperate slidably with the connecting section in the evaporation case 1, and enter and exit the evaporation case 1 through the end portion(s) corresponding to the first end plate and/or the second end plate, so that the material in the crucible 2 can be filled and replaced, and the crucible 2 can be cleaned. Furthermore in the evaporation source according to the embodiment of the disclosure, the heating unit 3 is arranged on the flow path of the organic vapor so that there is no cooling area throughout the evaporation source, the organic vapor can flow more stably, and the utilization ratio of the material can be improved. Lastly the flow path in the evaporation source according to the embodiment of the disclosure is more reasonable so that the organic vapor guided out of the gas outlet hole 221 of the evaporation cell flows over the flow path between the evaporation cell and the evaporation case 1, and be jetted out of the nozzle group 11, so the amount of organic vapor flowing over the flow path can be stable and uniform, so the amount of vapor jetted out of the nozzle group 11 can also be stable and uniform, and no vapor will be sprayed.

Accordingly the components in the evaporation source are structurally modified to change the jetting direction through the nozzles so as to avoid the substrate 8 from being deformed, and the metal particles from being deposited on the substrate 8, which would otherwise have resulted in a defect of the product, using the evaporation device including the evaporation source.

Further to the technical solution above, in order to guarantee the stability of the crucible 2 installed in the evaporation case 1, in some embodiments, each of the connecting section sections sections includes a hook 24 arranged on the top plate of the evaporation case 1. The hook includes a connection area extending in the direction from the top plate to the bottom plate, and a bearing area perpendicular to the extending direction of the connection area, and configured to cooperate slidably with the folded side 22 of the crucible 2, the folded side 22 of the crucible 2 laps the side of the bearing area facing the top plate, and the plurality of gas outlet holes of the crucible 2 are arranged in the part of the folded side 22, which doesn't lap the bearing area.

It shall be noted that when the crucible 2 is to be removed or installed, the crucible body 21 may be drawn according to the slidable connection relationship between the folded side 22 of the crucible 2 and the bearing area of the hook to enter or exit the evaporation case 1 through the first end cover or the second end cover.

Further to the technical solution above, in some embodiments, further referring to FIG. 1, the evaporation source according to the embodiment of the disclosure further includes a cooling unit 4 configured to cool the evaporation case 1.

The cooling unit 4 is arranged on the outside of the evaporation case 1, and the cooling unit 4 includes a bottom cooling unit 44 configured to support and cool the bottom plate of the evaporation case 1; the bottom cooling unit 44 is removably connected with the evaporation chamber 6 in the evaporation device through the connecting assembly 61; and the bottom cooling unit 44 is provided with the slit 441 so that the nozzle group 11 extends out of the slit, and faces the bottom of the evaporation chamber 6.

It shall be noted that the cooling unit 4 is arranged on the outside of the evaporation case 1, and includes the bottom cooling unit 44 configured to support and fix the evaporation case 1, and the bottom cooling unit 44 is removably connected with the evaporation chamber 6 in the evaporation device through the connecting assembly 61, so that the nozzle group of the evaporation case 1 in the evaporation chamber 6 faces the bottom of the evaporation chamber 6. As can be apparent from the structure above, when the evaporation chamber 6 is disconnected from the bottom cooling unit 44, the evaporation case 1 can be removed.

In summary, in the evaporation source according to the embodiment of the disclosure, the evaporation source can be arranged upside down as a whole using the bottom cooling unit 44 in the cooling unit 4, so that the nozzle group 11 in the evaporation source faces the bottom of the evaporation chamber 6 in the evaporation device, but also the bottom cooling unit 44 can be removably connected with the connecting assembly 61 to thereby make it possible to remove the evaporation source from the evaporation device, and to maintain it so as to facilitate later use and maintenance thereof.

It shall be noted that the cooling unit 4 cools the evaporation case 1, so that thermal exchange between the evaporation case 1 and the inside of the evaporation chamber 6 can be alleviated in effect to thereby better maintain a temperature balance inside the evaporation chamber 6.

Further to the technical solution above, in some embodiments, the cooling unit 4 further includes a top cooling unit 41 configured to cool the top plate of the evaporation case 1, a first side cooling unit 42 configured to cool the first side plate, and a second side cooling unit 43 configured to cool the second side plate.

It shall be noted that this structure can cool the evaporation case 1 in the respective directions to thereby improve the effect of cooling the evaporation case 1.

Specifically the top cooling unit 41 is hung on the top plate of the evaporation chamber 6, and the first side cooling unit 42 and the second side cooling unit 43 are installed respectively inside the evaporation chamber 6.

In some embodiments, the cooling unit 4 is a water-cooling plate.

In order to further guarantee the effect of heating by the heating unit 3 the organic vapor flowing over the flow path, and to alleviate heat produced by the heating unit 3 from being dissipated through the evaporation case 1, in some embodiments, the evaporation source further includes a heat preserving unit 5 arranged on the outside of the evaporation case 1.

In some embodiments, the heat preserving unit 5 includes a first side heat preserving plate 52 arranged between the first side plate and the first side cooling unit 42, a second side heat preserving plate 53 arranged between the second side plate and the second side cooling unit 43, a top heat preserving plate 51 arranged between the top plate of the evaporation case 1 and the top cooling unit 41, and a bottom heat preserving plate 53 arranged between the bottom plate of the evaporation case 1 and the bottom cooling unit 44.

Furthermore the respective heat preserving plates may be structured integral, or may be structured removable from each other.

In some embodiments, the first side heat preserving plate 52, the second side heat preserving plate 53, the top heat preserving plate 51, and the bottom heat preserving plate 54 may be connected removably with each other. It shall be noted that the respective heat preserving plates may be connected removably with each other so that an operating worker may install and remove the heat preserving plates.

Further to the technical solution above, in order to guarantee the stability of the position where the evaporation case 1 is arranged, and to reserve a space, in which the bottom heat preserving plate 54 is arranged, between the evaporation case 1 and the bottom cooling unit 44, in some embodiments, a fixing component 442 is arranged on the side of the bottom cooling unit 44 facing the evaporation case 1, and a long groove 541 corresponding in shape to the fixing component 442 is arranged on the bottom heat preserving plate 54, so that the fixing component 442 extends out of the long groove 541 to support the evaporation case 1.

In some embodiments, the heating unit 3 includes a first side heating plate 31 arranged on one side of the first side plate facing the crucible 2, a second side heating plate 32 arranged on one side of the second side plate facing the crucible 2, and a bottom heating plate 33 arranged on one side of the bottom plate facing the crucible 2.

It shall be noted that the first side heating plate 31, the second side heating plate 32, and the bottom heating plate 33 are arranged to heat the organic vapor flowing over the evaporation path all the time, so that there is no cooling area throughout the evaporation path, thus guaranteeing the stability of the temperature of the organic vapor being jetting from the gas outlet hole 221 until it is jetted out of the nozzles.

Since the temperature of the organic vapor flowing through the gas outlet hole 221 to the nozzles gradually drops when the heating unit 3 is not arranged, the heating temperature of the heating unit 3 is set ascending in the direction from the gas outlet hole 221 to the nozzles in some embodiments.

Accordingly when the respective heating plates are arranged with heating wires, the respective heating plates can be regarded as a heater including heating wires, the number of which is incrementing in the direction from the gas outlet hole 221 to the nozzles.

Further referring to FIG. 1, an embodiment of the disclosure further provides an evaporation device including an evaporation chamber 6, a bearing platform 7 arranged in the evaporation chamber 6, and the evaporation source according to any one of the embodiments above of the disclosure arranged in the evaporation chamber 6.

The bearing platform 7 has a bearing face arranged on the side thereof facing the evaporation source, the bearing face is configured to bear the substrate 8, and the bearing platform 7 has a sliding assembly on the side thereof away from the bearing face, the sliding assembly is configured to cooperate slidably with the bottom of the evaporation chamber 6 so that the bearing platform 7 can slide relative to the bottom of the evaporation chamber 6.

In the evaporation device above, the nozzle group 11 of the evaporation source faces the bottom of the evaporation chamber 6, so that the bearing platform 7 faces the top of the evaporation chamber 6, and the sliding assembly of the bearing platform 7 to be connected slidably with the evaporation chamber 6 is located on the side of the bearing face away from the evaporation source, so when the substrate 8 and a mask with a large size are arranged on the bearing face, they cannot be deformed or bent due to their gravities. Since the substrate 8 is located above the bearing platform 7 and the sliding assembly, metal dust or the like produced while the sliding assembly is sliding cannot be deposited on the surface of the substrate 8 to thereby alleviate a defect of the product from arising from the deposition of the metal dust or the like, so as to improve the good yield of the product. Furthermore a mask frame may not be provided in the evaporation device according to the embodiment of the disclosure, thus lowering a cost of depositing a film on the substrate 8.

Further to the technical solution above, specifically the evaporation chamber 6 includes a connecting assembly 61 arranged on the top of the evaporation chamber 6, and the evaporation source is connected removably with the connecting assembly 61 through the bottom cooling unit 44.

Further to the technical solution above, in order to better fix the substrate 8 in position to thereby make it easier to evaporation the product, in some embodiments, a fixing device 71 configured to fix the substrate 8 is arranged on the bearing face of the bearing platform 7.

Figure 3:
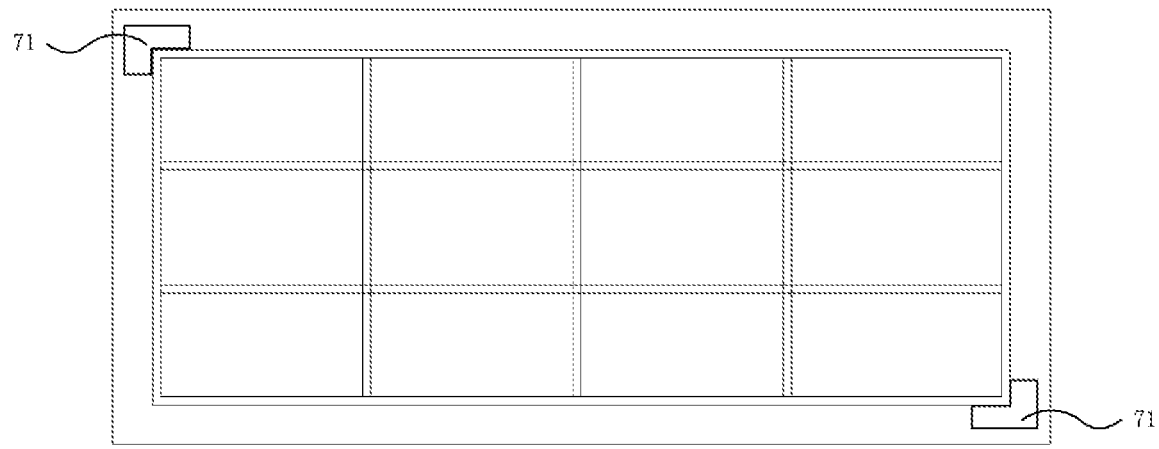
FIG. 3 is a top view of a bearing platform in an evaporation device according to an embodiment of the disclosure.

Specifically referring to FIG. 3, the fixing device 71 includes a pair of right-angled positioning components located on a diagonal line, where the inner side of each right-angled positioning component is configured to clamp a corner of the substrate 8 on the bearing face.

In some embodiments, in order to enable a mechanical hand or another picking device to pick up the substrate 8 after evaporation, the bearing face is arranged with at least one groove 72 configured to enable the substrate 8 to be picked.

It shall be noted that in order to maintain the stability of the mechanical hand or the other picking device picking the substrate 8, in some embodiments, the number of the grooves is at least three.

Further to the technical solution above, it shall be noted that the sliding assembly between the bearing platform 7 and the bottom of the evaporation chamber 6 can be embodied in a number of structures specifically including at least one of the following several structures.

Figure 4:
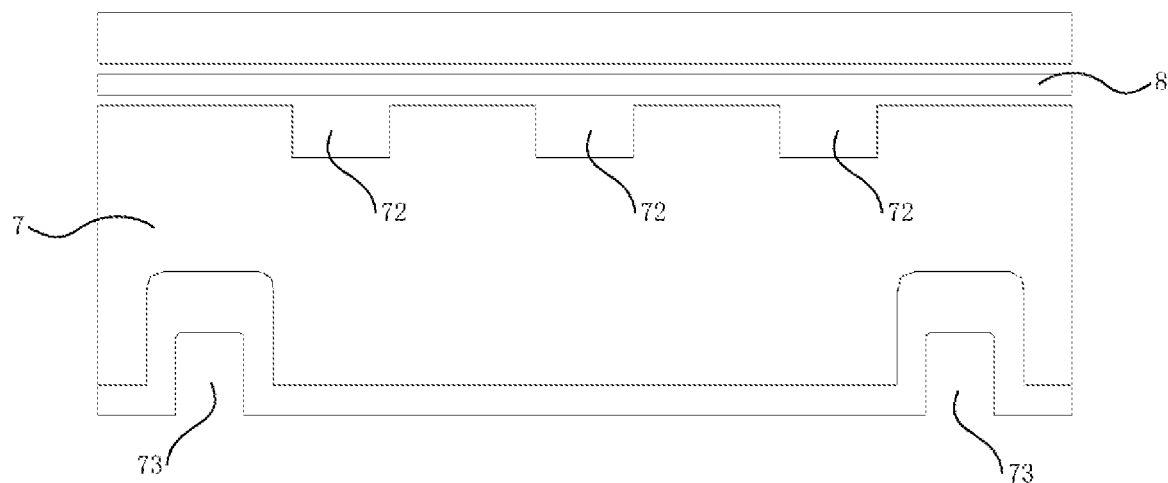
FIG. 4 is a schematic structural diagram of a bearing platform according to an embodiment of the disclosure.

In a first structure, the side of the bearing platform 7 away from the bearing face cooperates slidably with the bottom plate of the evaporation chamber 6 through a sliding rail and a sliding groove 73, and for example, as illustrated in FIG. 4, the sliding groove 73 is arranged on the bearing platform 7.

Figure 5:
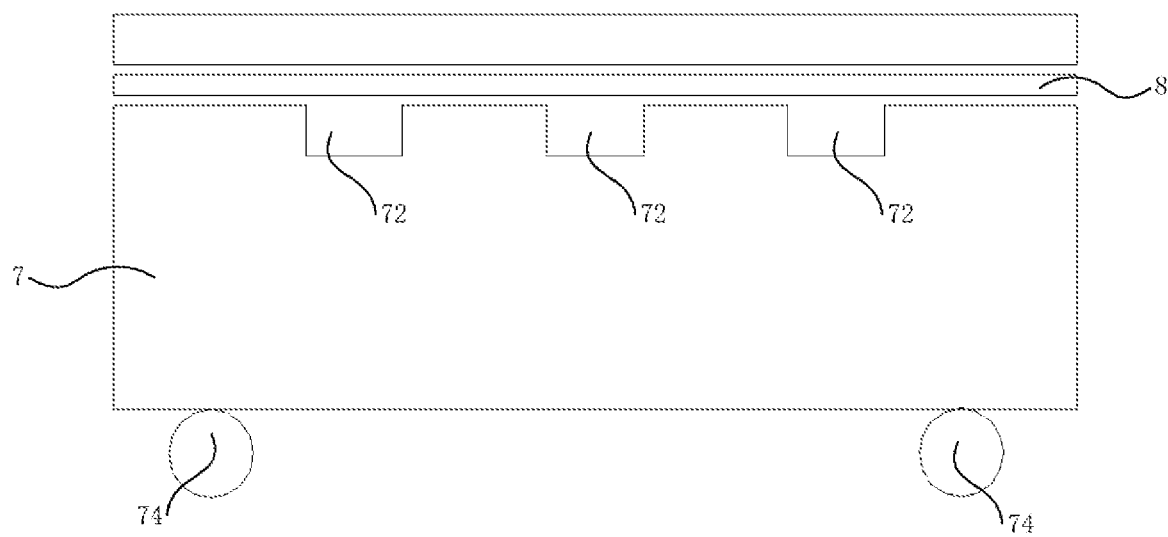
FIG. 5 is another schematic structural diagram of a bearing platform according to an embodiment of the disclosure.

In a second structure, the side of the bearing platform 7 away from the bearing face cooperates slidably with the bottom plate of the evaporation chamber 6 through rolling wheels 74 and a rolling rail, and for example, as illustrated in FIG. 5, the rolling wheels 74 are arranged on the bearing platform 7.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An evaporation source for an evaporation device, comprising: a rectangular cuboid evaporation case, a crucible, and a heating unit, wherein:

the evaporation case comprises a top plate and a bottom plate arranged opposite to each other, a first side plate and a second side plate located between the top plate and the bottom plate and arranged opposite to each other, a first end plate and a second end plate which are selectively opened and closed, located between the top plate and the bottom plate and arranged opposite to each other, and two connecting sections arranged on a side of the top plate facing the bottom plate to cooperate slidably with the crucible so that the crucible enters or exits through an end portion corresponding to the first end plate and/or the second end plate, wherein the bottom plate is provided with a nozzle group configured to jet gas in a direction away from the top plate;

the crucible comprises a crucible body with an opening facing the top plate, and two folded sides arranged on an outside of the crucible body, a plurality of gas outlet holes are arranged in the folded sides, and the crucible body cooperates slidably with the connecting sections through the folded sides; and when the first end plate and the second end plate are closed, the crucible, the connecting sections, the top plate, and the folded sides cooperate to form an evaporation cell; and the heating unit is arranged inside the evaporation case and outside the evaporation cell.

2. The evaporation source according to claim 1, wherein each of the connecting sections comprises a hook arranged on the top plate of the evaporation case, the hook comprises a connection area extending in a direction from the top plate to the bottom plate, and a bearing area perpendicular to the extending direction of the connection area and configured to cooperate slidably with one of the folded sides of the crucible, the one folded side of the crucible laps a side of the bearing area facing the top plate, and the plurality of gas outlet holes of the crucible are arranged in a part of the folded side, which does not lap the bearing area.

3. The evaporation source according to claim 1, further comprising a cooling unit configured to cool the evaporation case; and a connecting assembly comprising two vertical walls, the cooling unit is arranged on an outside of the evaporation case, and the cooling unit comprises a bottom cooling unit configured to support and cool the bottom plate of the evaporation case; the bottom cooling unit is removably connected with an evaporation chamber in the evaporation device through the connecting assembly; and the bottom cooling unit is provided with a slit so that the nozzle group extends out of the slit and faces a bottom of the evaporation chamber.

4. The evaporation source according to claim 3, wherein the cooling unit further comprises a top cooling unit configured to cool the top plate of the evaporation case, a first side cooling unit configured to cool the first side plate, and a second side cooling unit configured to cool the second side plate.

5. The evaporation source according to claim 4, wherein each of the bottom cooling unit, the top cooling unit, the first side cooling unit, and the second side cooling unit is a water-cooling plate.

6. The evaporation source according to claim 4, wherein the evaporation source further comprises a heat preserving unit arranged on the outside of the evaporation case.

7. The evaporation source according to claim 6, wherein the heat preserving unit comprises a first side heat preserving plate arranged between the first side plate and the first side cooling unit, a second side heat preserving plate arranged between the second side plate and the second side cooling unit, a top heat preserving plate arranged between the top plate of the evaporation case and the top cooling unit, and a bottom heat preserving plate arranged between the bottom plate of the evaporation case and the bottom cooling unit.

8. The evaporation source according to claim 7, a long groove is arranged on the bottom heat preserving plate, a protrusion from the bottom cooling unit extends out of the long groove to support the evaporation case.

9. The evaporation source according to claim 1, wherein the heating unit comprises a first side heating plate arranged on a side of the first side plate facing the crucible, a second side heating plate arranged on a side of the second side plate facing the crucible, and a bottom heating plate arranged on a side of the bottom plate facing the crucible.

10. An evaporation device, comprising: an evaporation chamber, a bearing platform arranged in the evaporation chamber, and the evaporation source according to claim 1 arranged in the evaporation chamber, wherein:

the bearing platform is provided with a bearing face on a side thereof facing the evaporation source, so that the bearing platform is capable of sliding on a bottom of the evaporation chamber, the bearing face is configured to bear a substrate.

11. The evaporation device according to claim 10, wherein the evaporation chamber comprises a connecting assembly comprising two vertical walls, arranged on a top of the evaporation chamber, and the evaporation source is connected removably with the connecting assembly through a bottom cooling unit.

12. The evaporation device according to claim 10, wherein a fixing device configured to fix the substrate is arranged on the bearing face of the bearing platform.

13. The evaporation device according to claim 12, wherein the fixing device comprises a pair of right-angled positioning components located on a diagonal line, and an inner side of each right-angled positioning component is configured clamp a corner of the substrate on the bearing face.

14. The evaporation device according to claim 10, wherein the bearing face is arranged with at least one groove configured to enable the substrate to be picked.

15. The evaporation device according to claim 10, wherein the bearing platform comprises a sliding groove.

16. The evaporation device according to claim 10, wherein the bearing platform comprises rolling wheels.

\* \* \* \* \*